(12) United States Patent
Yang et al.

(10) Patent No.: US 11,168,252 B2
(45) Date of Patent: Nov. 9, 2021

(54) QUANTUM DOT MATERIAL, PREPARATION METHOD, AND SEMICONDUCTOR DEVICE

(71) Applicant: TCL TECHNOLOGY GROUP CORPORATION, Huizhou (CN)

(72) Inventors: Yixing Yang, Huizhou (CN); Zheng Liu, Huizhou (CN); Lei Qian, Huizhou (CN)

(73) Assignee: TCL TECHNOLOGY GROUP CORPORATION, Shenzhen (CN)

( * ) Notice: Subject to any disclaimer, the term of this patent is extended or adjusted under 35 U.S.C. 154(b) by 333 days.

(21) Appl. No.: 15/761,716

(22) PCT Filed: Apr. 14, 2017

(86) PCT No.: PCT/CN2017/080588
§ 371 (c)(1),
(2) Date: Mar. 20, 2018

(87) PCT Pub. No.: WO2018/120510
PCT Pub. Date: Jul. 5, 2018

(65) Prior Publication Data
US 2019/0062634 A1 Feb. 28, 2019

(30) Foreign Application Priority Data
Dec. 30, 2016 (CN) .......................... 201611256988.3

(51) Int. Cl.
| | | |
|---|---|---|
| C09K 11/88 | (2006.01) | |
| H01L 51/00 | (2006.01) | |
| H01L 51/50 | (2006.01) | |
| H01L 33/06 | (2010.01) | |
| H01L 51/52 | (2006.01) | |
| H01L 31/0352 | (2006.01) | |
| H01L 51/56 | (2006.01) | |
| B82Y 20/00 | (2011.01) | |
| B82Y 40/00 | (2011.01) | |
| B82Y 30/00 | (2011.01) | |

(52) U.S. Cl.
CPC ............ *C09K 11/883* (2013.01); *H01L 33/06* (2013.01); *H01L 51/006* (2013.01); *H01L 51/0035* (2013.01); *H01L 51/0042* (2013.01); *H01L 51/0072* (2013.01); *H01L 51/502* (2013.01); *B82Y 20/00* (2013.01); *B82Y 30/00* (2013.01); *B82Y 40/00* (2013.01); *H01L 31/035218* (2013.01); *H01L 51/001* (2013.01); *H01L 51/004* (2013.01); *H01L 51/0021* (2013.01); *H01L 51/0037* (2013.01); *H01L 51/0058* (2013.01); *H01L 51/5056* (2013.01); *H01L 51/5068* (2013.01); *H01L 51/5072* (2013.01); *H01L 51/5084* (2013.01); *H01L 51/5206* (2013.01); *H01L 51/5088* (2013.01); *H01L 51/5221* (2013.01); *H01L 51/56* (2013.01); *H01L 2251/301* (2013.01); *H01L 2251/303* (2013.01); *H01L 2251/5346* (2013.01); *H01L 2251/5353* (2013.01); *H01L 2251/558* (2013.01)

(58) Field of Classification Search
CPC ....... C09K 11/565; B82Y 20/00; B82Y 40/00; B82Y 30/00
See application file for complete search history.

(56) References Cited

U.S. PATENT DOCUMENTS

| | | | |
|---|---|---|---|
| 7,767,260 B2 * | 8/2010 | Peng ..................... | C09K 11/025 427/214 |
| 7,777,233 B2 * | 8/2010 | Kahen .................. | C09K 11/025 257/79 |
| 7,919,012 B2 | 4/2011 | Peng et al. | |
| 7,935,419 B1 * | 5/2011 | Hollingsworth ...... | H01L 29/127 428/403 |
| 8,247,795 B2 | 8/2012 | Jun et al. | |

(Continued)

FOREIGN PATENT DOCUMENTS

| | | |
|---|---|---|
| CN | 101016461 A | 8/2007 |
| CN | 101842460 A | 9/2010 |

(Continued)

OTHER PUBLICATIONS

Cho, Junsang, el al,, "Kinetic Studies on the Formation of Various II-VI Semiconductor Nanocrystals and Synthesis of Gradient Alloy Quantum Dots Emitting in the Entire Visible Range" Journal of Materials Chemistry. (2012).*

(Continued)

*Primary Examiner* — C Melissa Koslow
(74) *Attorney, Agent, or Firm* — Anova Law Group, PLLC

(57) ABSTRACT

The present invention provides a QD material, a preparation method, and a semiconductor device. The QD material includes a number of N QD structural units arranged sequentially along a radial direction of the QD material, where N≥1. Each QD structural unit has a gradient alloy composition structure with an energy level width increasing along the radial direction from the center to the surface of the QD material. Moreover, the energy level widths of adjacent QD structural units are continuous. The present invention provides a QD material having a gradient alloy composition along the radial direction from the center to the surface. The disclosed QD material not only achieves higher QD light-emitting efficiency, but also meets the comprehensive requirements of semiconductor devices and corresponding display technologies on QD materials. Therefore, the disclosed QD material is a desired QD light-emitting material suitable for semiconductor devices and display technologies.

22 Claims, 6 Drawing Sheets

(56) References Cited

U.S. PATENT DOCUMENTS

| | | | |
|---|---|---|---|
| 9,887,318 B2* | 2/2018 | Titov | H01L 33/06 |
| 2003/0017264 A1 | 1/2003 | Treadway et al. | |
| 2010/0224244 A1 | 9/2010 | Furusawa | |
| 2010/0289003 A1* | 11/2010 | Kahen | C09K 11/883 |
| | | | 257/14 |
| 2011/0311453 A1 | 12/2011 | Nie et al. | |
| 2014/0022779 A1* | 1/2014 | Su | F21V 9/38 |
| | | | 362/231 |
| 2015/0027016 A1 | 1/2015 | Best et al. | |
| 2015/0214433 A1 | 7/2015 | Tran et al. | |
| 2016/0233378 A1 | 8/2016 | Titov et al. | |

FOREIGN PATENT DOCUMENTS

| | | | |
|---|---|---|---|
| CN | 101851498 A | | 10/2010 |
| CN | 103090277 A | | 5/2013 |
| CN | 104134711 A | | 11/2014 |
| CN | 104736234 A | | 6/2015 |
| CN | 104864318 A | | 8/2015 |
| CN | 105140394 A | | 12/2015 |
| CN | 105204103 A | | 12/2015 |
| CN | 105261709 A | | 1/2016 |
| CN | 105405941 A | | 3/2016 |
| CN | 105493295 A | | 4/2016 |
| CN | 105830236 A | | 8/2016 |
| CN | 106189515 A | | 12/2016 |
| CN | 106601886 B | | 3/2019 |
| EP | 2292718 A2 | | 3/2011 |
| JP | 2012087220 A | | 5/2012 |
| WO | 2008038970 A1 | | 4/2008 |
| WO | WO 2015/057944 | * | 4/2015 |

OTHER PUBLICATIONS

The World Intellectual Property Organization (WIPO) International Search Report and Written Opinion for PCT/CN2017/080588 dated Sep. 19, 2017 5 pages.

Peng, Xiaogang, et al, "Epitaxial Growth of Highly Luminescent CdSe/CdS Core/Shell Nanocrystals with Photostability and Electronic Accessibility", J. Am. Chem. Soc. 1997, 119, the Department of Chemistry, UniVersity of California, Berkeley, and Molecular Design Institute, Lawrence Berkeley Laboratory, Berkeley, California. Mar. 10, 1997, pp. 7019-7029.

Talapin, Dmitri V., et al, "CdSe/CdS/ZnS and CdSe/ZnSe/ZnS Core-Shell-Shell Nanocrystals", J. Phys. Chem. B 2004, 108, Institute of Physical Chemistry, UniVersity of Hamburg, Grindelallee 117, 20146 Hamburg, Germany, and Institut fur Physik, Humboldt-UniVersitat zu Berlin, HausVogteiplatz 5-7, 10117 Berlin, Germany, Sep. 17, 2004, pp. 18826-18831.

Hines, Margaret A., et al, "Synthesis and Characterization of Strongly Luminescing ZnS-Capped CdSe Nanocrystals",J. Phys. Chem. 1996, James Franck Institute, The University of Chicago, Chicago, Illinois 60637, Oct. 16, 1995, pp. 468-471.

Zhong, Xinhua, et al., "Composition-Tunable $Zn_x Cd_{1-x} Se$ Nanocrystals with High Luminescence and Stability." Journal of the American Chemical Society, 125.28 (2003): 8589-8594.

Cho, Junsang, et al., "Kinetic Studies on the Formation of Various II-VI Semiconductor Nanocrystals and Synthesis of Gradient Alloy Quantum Dots Emitting in the Entire Visible Range." Journal of Materials Chemistry, (2012).

Ziegler, Jan, et al. "High-Quality Zns Shells for Cdse Nanoparticles: Rapid Microwave Synthesis." Langmuir 23.14 (2007): 7751-7759.

Roy, Debjit, et al. "Spectral and Temporal Optical Behavior Of Blue-, Green-, Orange-, and Red-Emitting Cdse-Based Core/Gradient Alloy Shell/Shell Quantum Dots: Ensemble And Single-Particle Investigation Results." (2016).

Fitzmorris, Bob C., et al. "Optical Properties and Exciton Dynamics of Alloyed Core/Shell/Shell $Cd_{1-x} Zn_x Se/ZnSe/ZnS$ Quantum Dots." ACS applied materials & interfaces, (2013): 2893-2900.

Lambert, Karel, et al. "PbTe|CdTe Core|Shell Particles by Cation Exchange, a HR-TEM study", Chem. Mater., vol. 21, No. 5, 2009, pp. 778-780.

* cited by examiner

QUANTUM DOT MATERIAL, PREPARATION METHOD, AND SEMICONDUCTOR DEVICE

CROSS REFERENCE TO RELATED APPLICATIONS

This application is a national phase of PCT application No. PCT/CN2017/080588, filed on Apr. 14, 2017, which claims priority to Chinese Patent Application No. CN2016112569883, filed on Dec. 30, 2016, the content of all of which is hereby incorporated by reference.

TECHNICAL FIELD

The present invention generally relates to the field of quantum dot technology and, more particularly, relates to a quantum dot material, a preparation method, and a semiconductor device.

BACKGROUND

Quantum dot (QD) is a special material that is confined to a size in the order of nanometers in all three dimensions. The remarkable quantum confinement effect leads to many unique nano-properties of QDs, such as continuously-adjustable emission wavelength, narrow emission wavelength, wide absorption spectrum, high emission intensity, long fluorescence lifetime, excellent biocompatibility, etc. These unique properties make QDs have a wide range of applications in various fields including flat panel display, solid state lighting, photovoltaic solar energy, biomarker, etc. Particularly, in the field of flat panel display, benefiting from the nano-material properties and the optimization of QDs, QD light-emitting diode (QLED) devices based on QD materials have already demonstrated great potential in many aspects, including improving display quality, optimizing device performance, reducing manufacturing costs, etc. Although in recent years, the performance of QLED devices in all aspects has been continuously improved, there is still a considerable gap between the requirements of industrial applications and the basic device performance parameters, such as device efficiency, device stability, etc. This gap greatly hinders the development and application of the QD light-emitting display technologies. Moreover, the unique properties of QD materials relative to conventional materials have been increasingly valued not only in the field of QLED devices, but also in many other fields. For example, photoluminescent devices, solar cells, display devices, photoelectric detectors, biological probes, nonlinear optical devices, etc. have attracted more and more attention. In the following, QLED devices are provided as examples for further illustration.

Although QDs have been investigated and developed as a classical nanomaterial for over 30 years, the research time on utilizing the excellent light-emitting properties of QDs and using them as light-emitting materials in QLED devices and corresponding displays is still short. At present, most of the development and research of QLED devices is based on QD materials in existing classical structure systems. The corresponding standard for QD materials screening and optimization is mainly based on the consideration of the light-emitting properties of QDs, such as the light-emission peak width of the QDs, solution quantum yield, etc. The QDs are directly applied to the QLED structures to obtain the corresponding performance results of the devices.

However, because QLED device and the corresponding display may be a complex system of photoelectronic devices, the performance of the device may be affected by many factors. For example, in a case just considering a QD material as the material of a core light-emitting layer, the performance metrics of the QD that need to be weighed may have already been quite complicated.

First, in QLED devices, QDs are present in a QD light-emitting layer in a form of a solidified film. Therefore, each light-emission performance parameter of the QD materials originally obtained in solutions may be significantly different after being formed in the solidified films. For example, the light-emission peak wavelength in solidified films may have different degrees of red-shift (i.e., shifting to a longer wavelength), the light-emission peak may be broadened, or the quantum yield may be reduced to various degrees. That is, the excellent light-emitting properties of QD materials in solutions may not be fully transferred into the QD solidified films in QLED devices. Therefore, when designing and optimizing the structure and the synthesis formula for a QD material, it is necessary to take into account both the optimization of the light-emitting properties of the QD material and the maximization of the inheritance of the light-emitting performance in the solidified film of the QD material.

Moreover, in a QLED device, the QD material emits light through electro-induced excitation. That is, after holes and electrons are injected from the anode and the cathode of the QLED device, respectively, the holes and the electrons are transmitted through corresponding functional layers in the QLED device and recombined at the QD light-emitting layer, and through radiation transition, light may be emitted. It can be seen from the above process that the light-emitting properties, e.g. light-emission efficiency, of the QD may only affect the efficiency of the radiation transition in the above emission process. However, the overall light-emission efficiency of the QLED device may also be affected by various other factors during the emission process, such as the charge injection and transmission efficiency of the holes and the electrons in the QD material, the relative charge balance between the holes and the electrons in the QD material, the recombination region of the holes and the electrons in the QD material, etc. Therefore, when designing and optimizing the structure of a QD material, especially when designing and optimizing the fine core-shell nano-structure of a QD, special consideration may need to be focused on the electrical properties of the QD after forming a solidified film, such as the charge injection and conduction properties of the QD, the fine band structure of the QD, the exciton lifetime of the QD, etc.

Further, considering that QLED devices and the corresponding displays will be manufactured by solution processes, e.g. inkjet printing, which demonstrate significant advantages in production cost in the future, the material design and development of QDs may need to consider the processing properties of QD solutions, including the dispersible solubility of QD solutions or printing inks, the stability of colloids, the formability of the printed films, etc. In the meantime, the development of QD materials may also need to be in cooperation with other functional layers of the QLED devices as well as the overall preparation process and the requirements of the devices.

Therefore, the traditional QD structure design, which considers only the improvement of the light-emitting properties of the QDs, cannot meet the comprehensive requirements of QLED devices and the corresponding display technologies on optical properties, electrical properties, and processing properties of QD materials. It is necessary to optimize the fine core-shell structure, the composition, the energy level, and other related properties of the QD light-emitting materials based on the requirements of the QLED devices and the corresponding display technologies.

Because of the high surface atomic ratio of QD, atoms that do not form dangling bonds with surface ligands may exist as surface defect states. These surface defect states may cause transitions through a non-radiative manner so that the quantum yield of QD may be greatly reduced. To prevent the problem, a semiconductor shell containing a semiconductor material different from the material of the original QD may be grown on the outer surface of the original QD to form a QD with a core-shell structure. As such, the light-emitting properties of QD may be significantly improved and, in the meantime, the stability of the QD may also be improved.

The QD materials that can be applied to the development of high-performance QLED devices are mainly QDs that have core-shell structures. The compositions of the core and the shell are respectively fixed, and the boundary between the core and the shell is well defined. The examples of such QDs include QDs with a CdSe/ZnS core-shell structure (J. Phys. Chem., 1996, 100 (2), 468-471), QDs with a CdSe/CdS core-shell structure (J. Am. Chem. Soc. 1997, 119 (30), 7019-7029), QDs with a CdS/ZnS core-shell structure, QDs with a CdS/CdSe/CdS core-multilayer-shell structure (U.S. Pat. No. 7,919,012 B2), QDs with a CdSe/CdS/ZnS core-multilayer-shell structure (J. Phy. Chem. B, 2004, 108 (49), 18826-18831), etc. In these QDs with core-shell structures, the compositions of the core and the shell are usually fixed, and are different from each other. In addition, the core-shell structure of these QDs is usually a binary compound system formed by a cation and an anion. In such a structure, because the core and the shell are grown independently and separately, the boundary between the core and the shell is well defined. That is, the core and the shell are distinguishable. As compared to the original single-composition QDs, the QDs with core-shell structures may improve the light-emission efficiency, the monodispersity, and the stability of the QDs.

Although the QDs with core-shell structures described above have partially improved the performance of QDs, the light-emitting performance of the QDs may still need to be improved because considerations for performance improvement are still based on how to improve light-emission efficiency of QD itself, no matter it is from the design strategy point of view, or from the optimization scheme point of view. Moreover, other special requirements of semiconductor devices on QD materials may also need to be taken into account in order to improve the performance of QDs.

Therefore, the existing technology of QD materials and corresponding semiconductor devices may still need to be improved and developed.

BRIEF SUMMARY OF THE INVENTION

In view of the above problems in the existing technology, the objective of the present invention is to provide a QD material, a preparation method, and a semiconductor device to improve the light-emitting performance of the existing QD materials, and thus solve the problem that the existing QD materials cannot meet the requirements of semiconductor devices.

The technical solution of the present invention is as follows. A QD material includes N QD structural units arranged sequentially along a radial direction of the QD material, where $N \geq 1$;

each QD structural unit has a gradient alloy composition structure with an energy level width gradually increasing along the radial direction from a center of the QD material to a surface of the QD material; and energy level widths of adjacent QD structural units are continuous.

In the QD material, the gradient alloy composition structure is a gradient alloy composition structure including Group II elements and Group VI elements.

In the QD material, an alloy composition of the QD structural unit is $Cd_xZn_{1-x}Se_yS_{1-y}$, where $0 \leq x \leq 1$, $0 \leq x \leq 1$, and x and y are not 0 or 1 at the same time.

In the QD material, in the QD structural unit, an alloy composition at point A is $Cd_x^A Zn_{1-x}^A Se_y^A S_{1-y}^A$, and an alloy composition at point B is $Cd_x^B Zn_{1-x}^B Se_y^B S_{1-y}^B$, where A is closer to the center of the QD material than point B, and the alloy composition at point A and the alloy composition at point B satisfy $x^A > x^B$, $y^A > y^B$.

In the QD material, the QD structural unit includes 2-20 monatomic layers, or 1-10 unit-cell layers.

In the QD material, along the radial direction, two monatomic layers at a boundary of adjacent QD structural units form a continuous alloy composition structure, or along the radial direction, two unit-cell layers at a boundary of adjacent QD structural units form a continuous alloy composition structure.

In the QD material, a light-emission peak wavelength of the QD material is in a range of approximately 400 nm to 700 nm.

In the QD material, a full width at half maximum of a light-emission peak of the QD material is in a range of approximately 12 nm to 80 nm.

A method for preparing the a QD material includes:
synthesizing a first compound;
synthesizing a second compound on a surface of the first compound, the second compound and the first compound having different alloy compositions;
forming the QD material through a cation exchange reaction between the first compound and the second compound, the light-emission peak wavelength of the QD material experiencing a continuous blue-shift to achieve a gradient alloy composition distribution.

In the method for preparing the QD material, a cation precursor of the first compound and/or the second compound includes a zinc precursor. The zinc precursor includes at least one of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and zinc stearate.

In the method for preparing the QD material, a cation precursor of the first compound and/or the second compound includes a cadmium precursor. The cadmium precursor includes at least one of dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphate, cadmium sulfate, cadmium oleate, and cadmium stearate.

In the method for preparing the QD material, an anion precursor of the first compound and/or the second compound includes a selenium precursor. The selenium precursor includes at least one of Se-TOP (selenium-trioctylphosphine), Se-TBP (selenium-tributylphosphine), Se-TPP (selenium-triphenylphosphine), Se-ODE (selenium-1-octadecene), Se-OA (selenium-oleic acid), Se-ODA (selenium-octadecylamine), Se-TOA (selenium-trioctylamine), Se-ODPA (selenium-octadecylphosphonic acid), and Se-OLA (selenium-oleylamine).

In the method for preparing the QD material, an anion precursor of the first compound and/or the second compound includes a sulfur precursor. The sulfur precursor includes at least one of S-TOP (sulfur-trioctylphosphine), S-TBP (sulfur-tributylphosphine), S-TPP (sulfur-triphenylphosphine), S-ODE (sulfur-1-octadecene), S-OA (sulfur-oleic acid), S-ODA (sulfur-octadecylamine), S-TOA (sulfur-trioctylamine), S-ODPA (sulfur-octadecylphosphonic acid), S-OLA (sulfur-oleylamine), and alkyl thiol.

In the method for preparing the QD material, an anion precursor of the first compound and/or the second compound includes a tellurium precursor. The tellurium precursor includes at least one of Te-TOP (tellurium-trioctylphosphine), Te-TBP (tellurium-tributylphosphine), Te-TPP (tellurium-triphenylphosphine), Te-ODE (tellurium-1-octadecene), Te-OA (tellurium-oleic acid), Te-ODA (tellurium-octadecylamine), Te-TOA (tellurium-trioctylamine), Te-ODPA (tellurium-octadecylphosphonic acid), and Te-OLA (tellurium-oleylamine).

In the method for preparing the QD material, the cation exchange reaction between the first compound and the second compound is performed under a heating condition.

In the method for preparing the QD material, a heating temperature is in a range of approximately 100° C. to 400° C.

In the method for preparing the QD material, a heating time is in a range of approximately 2 seconds to 24 hours.

In the method for preparing the QD material, a molar feed ratio of a cationic precursor to an anion precursor used for forming the first compound is in a range of approximately 100:1 to 1:50.

In the method for preparing the QD material, a molar feed ratio of a cationic precursor to an anion precursor used for forming the second compound is in a range of approximately 100:1 to 1:50.

A semiconductor device includes a QD material described above.

The semiconductor device is one of an electroluminescent device, a photoluminescent device, a solar cell, a display device, a photoelectric detector, a biological probe, and a nonlinear optical device.

Benefits: the present invention provides a QD material having a gradient alloy composition along the radial direction from the center to the surface. The disclosed QD material may not only achieve high QD light-emission efficiency, but also meet the comprehensive requirements of semiconductor devices and corresponding display technologies on QD materials. Therefore, the disclosed QD material is a desired QD light-emitting material suitable for semiconductor devices and display technologies.

DETAILED DESCRIPTION

The present invention provides a quantum dot (QD) material, a preparation method, and a semiconductor device. To make the objectives, technical schemes and results more explicit, further description will be made in detail to illustrate the present invention. It should be understood that the specific embodiments described herein are only used to explain the present invention, and are not intended to limit the scope of the present invention.

A quantum dot (QD) material provided in the present invention may include N QD structural units arranged sequentially along a radial direction, where N≥1.

The QD structural unit may have a gradient alloy composition structure with an energy level width increasing along the radial direction from the center to the surface of the QD material. In addition, the energy level widths of adjacent QD structural units are continuous.

Figure 1:
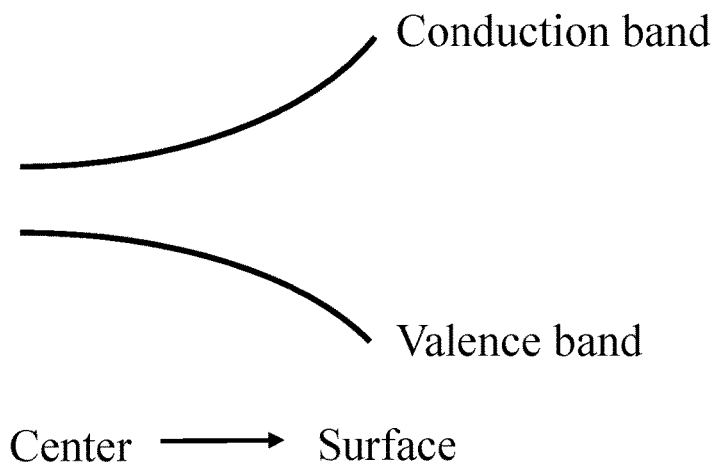
FIG. 1 illustrates a schematic diagram of an energy-level structure of an exemplary quantum dot (QD) material consistent with some embodiments of the present invention.

The energy-level structure of the QD material provided in the present disclosure is shown in FIG. 1. The QD material may be formed by a plurality of QD structural units arranged sequentially along the radial direction. The plurality of QD structural units may each have a gradient alloy composition structure with an energy level width increasing along the radial direction from the center to the surface of the QD material. In the following, the energy-level structure of the QD may be referred to as a funnel-shaped energy-level structure.

It should be noted that a radial direction may refer to a direction from the center of the QD material to the surface of the QD material. For example, when the QD material has a spherical structure or a sphere-like structure, a radial direction may be a direction along the radius of the spherical structure or the sphere-like structure. Similarly, a center of the QD material may refer to the center of the physical structure of the QD material, and a surface of the QD material may refer to the surface of the physical structure of the QD material.

Further, in adjacent QD structural units along the radial direction, the energy level width in the QD structural unit closer to the center may be smaller than the energy level width in the QD structure unit farther away from the center. That is, in the disclosed QD material, the energy level width may gradually increase from the center to the surface, and thus form a funnel-shaped structure with a gradually increased opening. Specifically, the gradually increased opening may refer to, in the energy-level structure shown in FIG. 1, the continuous increase trend of the energy level width from the center of the QD material to the surface of the QD material. In the meantime, in the disclosed QD material, the energy level width may change continuously between adjacent QD structural units. That is, the alloy composition of the QD may also change continuously, which may be conducive to achieving high light-emission efficiency.

For example, the gradient alloy composition structure may a gradient alloy composition structure including Group II and Group VI elements. The Group 11 elements may include, but are not limited to, Zn, Cd, Hg, and Cn.

The alloy composition of the QD structural unit may be $Cd_xZn_{1-x}Se_yS_{1-y}$, where $0 \leq x \leq 1$, $0 \leq y \leq 1$, and x and y are not both 0 or 1 at the same time. For example, the alloy composition at a position may be $Cd_{0.5}Zn_{0.5}Se_{0.5}S_{0.5}$, and the alloy composition at another point may be $Cd_{0.3}Zn_{0.7}Se_{0.4}S_{0.6}$.

In the QD structural unit, the alloy composition at point A may be $Cd_{x0}^A Zn_{1-x0}^A Se_{y0}^A S_{1-y0}^A$, and the alloy composition at point B may be $Cd_{x0}^B Zn_{1-x0}^B Se_{y0}^B S_{1-y0}^B$, where point A is closer to the center of the QD material than point B, and, the compositions at point A and point B satisfy: $x0^A > x0^B$, $y0^A > y0^B$. That is, for any two points in the QD material, e.g. point A and point B, when point A is closer to the center of the QD material than point B, $x0^A > x0^B$, and $y0^A > y0^B$. Therefore, the Cd concentration at point A may be larger than the Cd concentration at point B, the Zn concentration at point A may be smaller than the Cd concentration at point B, the Se concentration at point A may be larger than the Cd concentration at point B, and the S concentration at point A may be smaller than the Cd concentration at point B. As such, in the disclosed QD material, a gradient structure may be formed along the radial direction. In addition, along the radial direction from the center to the surface (i.e., along a direction away from the center of the QD material), the Cd concentration and the Se concentration may become lower, and the Zn concentration and the S concentration may become higher. According to the properties of these elements (i.e., Cd, Zn, Se, and S), the energy level width may become larger.

Further, the QD structural units may each include 2-20 monatomic layers. In some embodiments, the QD structural units may each include 2-5 monatomic layers to ensure a desired light-emitting quantum yield and high charge injection efficiency.

Further, each monatomic layer may be the smallest structural unit. That is, the alloy composition of each monatomic layer may be fixed.

Alternatively, the QD structural unit may each include 1-10 unit-cell layers. That is, each QD structural unit may include 1-10 unit-cell layers. For example, the QD structural units may include 2-5 unit-cell layers. The unit-cell layer may be the smallest structural unit and, thus, the alloy composition of each unit-cell layer may be fixed. That is, within each unit-cell layer, the lattice parameters and the elements included may be the same. Each QD structural unit may be a closed unit-cell surface formed through the continuous connection of the unit-cell layers.

In some embodiments, two monolayers at a boundary between adjacent QD structural units along the radial direction may form a gradient alloy composition structure. That is, two monolayers at a boundary of two QD structural units may have a continuous alloy composition structure. Accordingly, the energy level width may also change continuously, rather than discontinuously/abruptly, between the two QD structural units. As such, the energy-level curve of the entire QD material may be a continuous curve.

In other words, the disclosed QD material may be a QD structure having a continuous alloy composition from the center to the surface along the radial direction. The composition of the QD structure may demonstrate a continuous change from the center to the surface along the radial direction. Accordingly, the distribution of the energy level may also demonstrate a continuous change from the center to the surface along the radial direction. Therefore, the QD structure may demonstrate continuous changes in the composition and the distribution of the energy levels. Compared to QD materials with a well-defined boundary between the core and the shell, the disclosed QD material may not only be conducive to achieving higher light-emission efficiency, but also meet the comprehensive requirements of semiconductor devices and corresponding display technologies on QD materials. Therefore, the disclosed QD material is a desired QD light-emitting material suitable for semiconductor devices and display technologies.

In the present invention, a QD material using the structure described above may be able to achieve a light-emitting quantum yield in a range of approximately 1% to 100%. In some embodiments, the light-emitting quantum yield may be in a range of approximately 30% to 100% to ensure that the QDs have desired applicability.

Further, in the present invention, the light-emission peak wavelength of the QD material may be in a range of approximately 400 nm to 700 nm. That is, a QD material using the structure described above may have a light-emission peak wavelength in a range of approximately 400 nm to 700 nm. In some embodiments, the light-emission peak wavelength may be in a range of approximately 430 nm to 660 nm such that the QD material may be able to achieve a light-emitting quantum yield larger than 30%.

Further, in the present invention, the disclosed QD material may have a full width at half maximum (FWHM) of the light-emission peak of the QD material in a range of approximately 12 nm to 80 nm, e.g. 12 nm, 50 nm, and 80 nm.

The QD materials provided in the present invention may have the following advantages. First, the disclosed QD materials may be conducive to minimizing the lattice tension between QD crystals with different alloy compositions and reducing lattice mismatch. Thus, the formation of interfacial defects may be suppressed, and the light-emission efficiency of QD may be improved. Second, the energy-level structure formed by the QD material provided in the present invention may be conducive to effectively confining the electron clouds in the QDs, and may greatly reduce the diffusion probability of the electron clouds to the surface of the QDs. Therefore, the Auger recombination loss due to non-radiative transition of the QDs may be greatly suppressed, QD blinking may be reduced, and the light-emission efficiency of QDs may be improved. Third, the energy-level structure formed by the QD material provided in the present invention may be more conducive to improving the injection efficiency and the transmission efficiency of the QD light-emitting layers. In the meantime, the energy-level structure may also effectively prevent charge aggregation and, thus, avoid exciton quenching due to charge aggregation. Fourth, the easily-controllable and diversified energy-level structures formed by the QD material provided in the present invention may fully meet and cooperate with the energy-level structures of other functional layers of the device to achieve overall matching of the energy-level structures in the device. Therefore, the QD material provided in the present invention may be conducive to achieving highly-efficient semiconductor devices.

The present invention also provide a preparation method for the disclosed QD material. The preparation method may include the following steps:

synthesizing a first compound;

synthesizing a second compound on the surface of the first compound, the first compound and the second compound having different alloy compositions;

forming a QD material through a cation exchange reaction between the first compound and the second compound, the light-emission peak wavelength of the QD material experiencing a continuous blue-shift to achieve a gradient alloy composition distribution.

The disclosed preparation method combines a successive ionic layer adsorption and reaction (SILAR) QD synthesis method together with a one-step QD synthesis method to form QDs. Specifically, the QD SILAR synthesis method may be used to precisely control the layer-by-layer growth of the QD and the one-step QD synthesis method may be used to form a composition-gradient transition shell. That is, two layers of thin-film compounds having different alloy compositions may be formed sequentially at a position; and through a cation exchange reaction between the two layers of compounds, a desired distribution of the alloy composition at that position may then be achieved. In one embodiment, the inner and outer nanocrystals are the two thin-film compounds. Repeating the process described above may continue to achieve the desired distribution of the alloy composition at various positions along the radial direction. Due to the continuous blue-shift experienced during the repetition, the QD material as a whole may have a gradient alloy composition distribution.

The first compound and the second compound can each be a binary compound or a compound containing more than two elements.

The light-emission peak wavelength of the QD material may experience a continuous blue-shift. When the light-emission peak wavelength experiences a blue-shift, the light-emission peak may move towards a shorter wavelength and, thus, the energy level width may become larger; when the light-emission peak wavelength experiences a red-shift, the light-emission peak may move towards a longer wavelength and, thus, the energy level width may become smaller; and, when the light-emission peak wavelength experiences no-shift, the energy level width may remain unchanged. In the present invention, the light-emission peak wavelength experiencing a continuous blue-shift may indicate that the energy level width between QD structural units increases continuously (as shown in FIG. 1).

The cation precursor of the first compound and/or the second compound may include a zinc precursor, including at least one of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, zinc stearate, etc.

The cation precursor of the first compound and/or the second compound may include a cadmium precursor, including at least one of dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphate, cadmium sulfate, cadmium oleate, and cadmium stearate, etc.

The anion precursor of the first compound and/or the second compound may include a selenium precursor, such as compounds formed by Se and any appropriate organic material. For example, the selenium precursor may include at least one of Se-TOP (selenium-trioctylphosphine), Se-TBP (selenium-tributylphosphine), Se-TPP (selenium-triphenylphosphine), Se-ODE (selenium-1-octadecene), Se-OA (selenium-oleic acid), Se-ODA (selenium-octadecylamine), Se-TOA (selenium-trioctylamine), Se-ODPA (selenium-octadecylphosphonic acid), Se-OLA (selenium-oleylamine), etc.

The anion precursor of the first compound and/or the second compound may include a sulfur precursor, such as compounds formed by S and any appropriate organic material. For example, the sulfur precursor may include at least one of S-TOP (sulfur-trioctylphosphine), S-TBP (sulfur-tributylphosphine), S-TPP (sulfur-triphenylphosphine), S-ODE (sulfur-1-octadecene), S-OA (sulfur-oleic acid), S-ODA (sulfur-octadecylamine), S-TOA (sulfur-trioctylamine), S-ODPA (sulfur-octadecylphosphonic acid), S-OLA (sulfur-oleylamine), etc. Alternatively, the sulfur precursor may be alkyl thiol, including at least one of hexanethiol, octanethiol, decanethiol, dodecanethiol, hexadecanethiol, mercaptopropylsilane, etc.

The anion precursor of the first compound and/or the second compound may also include a tellurium precursor, including at least one of Te-TOP (tellurium-trioctylphosphine), Te-TBP (tellurium-tributylphosphine), Te-TPP (tellurium-triphenylphosphine), Te-ODE (tellurium-1-octadecene), Te-OA (tellurium-oleic acid), Te-ODA (tellurium-octadecylamine), Te-TOA (tellurium-trioctylamine), Te-ODPA (tellurium-octadecylphosphonic acid), Te-OLA (tellurium-oleylamine), etc.

Based on the QD material to be formed, one or more compounds may be selected for the cation precursor and the anion precursor. For example, to synthesize QD materials with an alloy composition of $Cd_xZn_{1-x}Se_yS_{1-y}$, a cadmium precursor, a zinc precursor, a selenium precursor, and a sulfur precursor may be required; to synthesize QD materials with an alloy composition of $Cd_xZn_{1-x}S$, a cadmium precursor, a zinc precursor, and a sulfur precursor may be required; to synthesize QD materials with an alloy composition of $Cd_xZn_{1-x}Se$, a cadmium precursor, a zinc precursor, and a selenium precursor may be required.

In the disclosed preparation method, the condition for the cation exchange reaction may be a heating condition. For example, the heating temperature may be in a range of approximately 100° C. to 400° C. In some embodiments, the heating temperature may be in a range of approximately 150° C. to 380° C. A heating time may be in a range of approximately 2 seconds to 24 hours. In some embodiments, the heating time may be in a range of approximately 5 minutes to 4 hours.

When the heating temperature is higher, the reaction rate of the cation exchange reaction may be larger, and the thickness range and the degree of the cation exchange may also become larger. However, the thickness range and the degree of the cation exchange may be gradually saturated. Similarly, when the heating time is longer, the thickness range and the degree of the cation exchange may become larger; however, the thickness range and the degree of the cation exchange may also be gradually saturated. The thickness range and the degree of exchange reaction may directly determine the distribution of the gradient alloy composition. In the meantime, the distribution of the gradient alloy composition formed through the cation exchange reaction may also be determined by the thickness of the binary or the multi-element-containing nano-crystals that are formed separately.

When forming each layer of compound, the cation precursor and the anion precursor may have a molar feed ratio in a range of approximately 100:1 to 1:50. For example, when forming the first layer of compound, the molar feed ratio of the cation precursor and the anion precursor may be in a range of approximately 100:1 to 1:50; when forming a second layer of compound, the molar feed ratio of the cation precursor and the anion precursor may be in a range of approximately 100:1 to 1:50. In some embodiments, the molar feed ratio of the cation precursor and the anion precursor may be in a range of approximately 20:1 to 1:10. Having a molar feed ratio of the cation precursor and the anion precursor in a range of approximately 20:1 to 1:10 may ensure the reaction rate within a range that can be easily controlled.

For a QD material prepared by the disclosed preparation method, the light-emission peak wavelength may be in a range of approximately 400 nm to 700 nm. In some embodiments, the light-emission peak wavelength may be in a range of approximately 430 nm to 660 nm to achieve a light-emitting quantum yield larger than 30%.

For a QD material prepared by the disclosed preparation method, the light-emitting quantum yield may be in a range of approximately 1% to 100%. In some embodiments, to ensure that the QDs have desired applicability, the light-emitting quantum yield may be in a range of approximately 30% to 100%.

In addition to the method for preparing QD materials described above, the present invention also provides another method for preparing QD materials. The preparation method may include:

adding one or more cation precursors to a position along the radial direction; and under certain conditions, simultaneously adding one or more anion precursors to form a QD material through the reaction between the cation precursors and the anion precursors. The light-emission peak wavelength of the QD material may experience a continuous blue-shift during the reaction process.

Different from the previously-described method, in which two layers of compounds may be formed first, and a cation exchange reaction may then be carried out to obtain a gradient alloy composition distribution, this latter method may directly control and add the cation precursors and the anion precursors that are required for synthesizing the desired alloy composition, and then form a QD material with the desired distribution of the alloy composition through reaction. For this latter method, the principle of the reaction is as follows. The cation precursors with higher reactivity may react with the anion precursors first, and then the cation precursors with lower reactivity may react with the anion precursors. In addition, during the reaction process, cation exchange reaction between different types of cations may also take place. As such, the gradient alloy composition distribution of the present invention may be achieved. The selections of the cation precursors and the anion precursors may be referred to the corresponding content in the description of the previously-described method. Similar to that in the previously-described method, different reaction temperatures, different reaction times, and/or different molar feed ratios of the cation precursors and the anion precursors may be used in the latter method based on the QD materials to be prepared. In the following, various exemplary embodiments will be provided to further illustrate the details of the disclosed preparation methods.

The present invention also provides a semiconductor device including a QD material consistent with the above description.

The semiconductor device may be one of an electroluminescent device, a photoluminescent device, a solar cell, a display device, a photoelectric detector, a biological probe, and a nonlinear optical device.

Taking an electroluminescent device as an example, a QD material provided in the present invention may be used as the material of a light-emitting layer in a QD electroluminescent device. The QD electroluminescent device may be able to achieve: 1) highly efficient charge injection; 2) high luminous brightness; 3) low driving voltage; 4) high device efficiency, and other desired device performance. At the same time, the disclosed QD material may also be easily controlled and may have a variety of energy-level structures. Therefore, the disclosed material may be able to fully meet and cooperate with the energy-level structures of other functional layers of the device to achieve overall matching of the energy-level structures in the device and, thus, may help achieve a highly-efficient semiconductor device.

The photoluminescent device may refer to a device that relies on irradiation of an external light source to obtain energy, generate excitation, and emit light. Ultraviolet radiation, visible light and infrared radiation can all lead to photoluminescence, including phosphorescence and fluorescence. The disclosed QD material may be used as a light-emitting material of a photoluminescent device.

The solar cell is also called a photovoltaic device. The disclosed QD material may be used as a light-absorption material of a solar cell to effectively improve various performance parameters of the photovoltaic device.

The display device may refer to a backlight module or a display panel adopting the backlight module. The display panel may be used in various products, including display screens, tablets, cell phones, notebook computers, flat-screen TVs, wearable display devices, and other products containing display panels in different sizes.

The photodetector may refer to a device that is able to convert optical signals into electrical signals. The principle of the photodetector is based on changes in the conductivity of a material upon irradiation. When a QD material is used in a photodetector, the photodetector may demonstrate the following advantages: sensitivity to normally incident light, high photoconductivity, high contrast detection rate, continuously-adjustable detection wavelength, and capability for low-temperature manufacturing. During the operation of a photodetector using the disclosed QD material, the photogenerated electron-hole pairs created after the photosensitive layer (i.e., a QD material according to the present invention) of the QD absorbs photons can be separated by a built-in electric field. As such, the driving voltage of the photodetector that uses the disclosed QD material may be lower. For example, the photodetector may be able to operate with a low applied bias voltage, or even with a zero bias voltage, and may be easily controlled.

The biological probe may refer to a device used for modifying certain type of materials to provide such materials with a marking function. For example, a QD material provided in the present invention may be coated to form a fluorescent probe used in the field of cell imaging or material detection. Compared to the traditional organic fluorescent dye probe, the biological probe prepared by using the disclosed QD material may have advanced characteristics such as high fluorescence intensity, desired chemical stability, and strong resistance to light bleaching. Therefore, the biological probe prepared by using the disclosed QD material may have a wide range of applications.

The nonlinear optical device may belong to the field of optical laser technology, and may have a wide range of applications. The applications of the nonlinear optical device may include the following examples. The nonlinear optical device may be used for electro-optic switching and laser modulation, may be used for laser frequency conversion and laser frequency tuning, may be used to process optical information and improve image quality and beam quality, may be used as a nonlinear etalon or a bistable device, and may be used for studying the highly-excited states and the high-resolution spectra of matter as well as the internal energy and excitation transfer process and other relaxation processes.

Embodiment 1: Preparation of a CdZnSeS/CdZnSeS-Based QD

First, a cationic cadmium precursor, a cationic zinc precursor, an anionic selenium precursor, and an anionic sulfur precursor may be injected into a reaction system to form a $Cd_yZn_{1-y}Se_bS_{1-b}$ layer, where $0 \leq y \leq 1$, $0 \leq b \leq 1$. Further, the cationic cadmium precursor, the cationic zinc precursor, the anionic selenium precursor, and the anionic sulfur precursor may be continuously injected into the reaction system to form a $Cd_zZn_{1-z}Se_cS_{1-c}$ layer on the surface of the $Cd_yZn_{1-y}Se_bS_{1-b}$ layer, where $0 \leq z \leq 1$, $0 \leq c \leq 1$, and z is not equal to y. Under certain reaction conditions including an appropriate heating temperature and an appropriate heating time, exchanges between Cd ions and Zn ions may take place in the inner and the outer nanocrystals (i.e., the two layers of compounds). Moreover, the migration distance of the cations is limited, and the migration probability decreases as the migration distance increases. Therefore, a gradient alloy composition distribution with varying Cd and Zn concentrations, i.e., $Cd_xZn_{1-x}Se_aS_{1-a}$, where $0 \leq x \leq 1$, $0 \leq a \leq 1$, may be formed at the interface between the $Cd_yZn_{1-y}Se_bS_{1-b}$ layer and the $Cd_zZn_{1-z}Se_cS_{1-c}$ layer.

Embodiment 2: Preparation of a CdZnS/CdZnS-Based QD

First, a cationic cadmium precursor, a cationic zinc precursor, and an anionic sulfur precursor may be injected into a reaction system to form a $Cd_yZn_{1-y}S$ layer, where $0 \leq y \leq 1$. Further, the cationic cadmium precursor, the cationic zinc precursor, and the anionic sulfur precursor may be continuously injected into the reaction system to form a $Cd_zZn_{1-z}S$ layer on the surface of the $Cd_yZn_{1-y}S$ layer, where $0 \leq z \leq 1$, and z is not equal to y. Under certain reaction conditions including an appropriate heating temperature and an appropriate heating time, exchanges between Cd ions and Zn ions may take place in the inner and the outer nanocrystals (i.e., the two layers of compounds). Moreover, the migration distance of the cations is limited, and the migration probability decreases as the migration distance increases. Therefore, a gradient alloy composition distribution with varying Cd and Zn concentrations, i.e., $Cd_xZn_{1-x}S$, where $0 \leq x \leq 1$, may be formed at the interface between the $Cd_yZn_{1-y}S$ layer and the $Cd_zZn_{1-z}S$ layer.

Embodiment 3: Preparation of a CdZnSe/CdZnSe-Based QD

First, a cationic cadmium precursor, a cationic zinc precursor, and an anionic selenium precursor may be injected into a reaction system to form a $Cd_yZn_{1-y}Se$ layer, where $0 \leq y \leq 1$. Further, the cationic cadmium precursor, the cationic zinc precursor, and the anionic selenium precursor may be continuously injected into the reaction system to form a $Cd_zZn_{1-z}Se$ layer on the surface of the $Cd_yZn_{1-y}Se$ layer, where $0 \leq z \leq 1$, and z is not equal to y. Under certain reaction conditions including an appropriate heating temperature and an appropriate heating time, exchanges between Cd ions and Zn ions may take place in the inner and the outer nanocrystals (i.e., the two layers of compounds). Moreover, the migration distance of the cations is limited, and the migration probability decreases as the migration distance increases. Therefore, a gradient alloy composition distribution with varying Cd and Zn concentrations, i.e., $Cd_xZn_{1-x}Se$, where $0 \leq x \leq 1$, may be formed at the interface between the $Cd_yZn_{1-y}Se$ layer and the $Cd_zZn_{1-z}Se$ layer.

Embodiment 4: Preparation of a CdS/ZnS-Based QD

First, a cationic cadmium precursor and an anionic sulfur precursor may be injected into a reaction system to form a CdS layer. Further, a cationic zinc precursor together with the anionic sulfur precursor may be injected into the reaction system to form a ZnS layer on the surface of the CdS layer. Under certain reaction conditions including an appropriate heating temperature and an appropriate heating time, the Zn cations in the outer layer may be gradually migrate to the inner layer and, thus, may exchange with the Cd ions in the inner layer. Similarly, the Cd ions in the inner layer may be gradually migrate to the out layer and, thus, may exchange with the Zn ions in the outer layer. Moreover, the migration distance of the cations is limited, and the migration probability decreases as the migration distance increases. Therefore, a gradient alloy composition distribution, with the Cd concentration gradually decreasing while the Zn concentration gradually increasing along the radial direction from the inner layer to the outer layer, i.e., $Cd_xZn_{1-x}S$, where $0 \leq x \leq 1$, may be formed near the interface between the CdS layer and the ZnS layer. In addition, the value of x may change monotonically from 1 to 0 along the direction from the inner layer to the outer layer (i.e., the radial direction).

Embodiment 5: Preparation of a CdSe/ZnSe-Based QD

First, a cationic cadmium precursor and an anionic selenium precursor may be injected into a reaction system to form a CdS layer. Further, a cationic zinc precursor together with the anionic selenium precursor may be injected into the reaction system to form a ZnSe layer on the surface of the CdSe layer. Under certain reaction conditions including an appropriate heating temperature and an appropriate heating time, the Zn cations in the outer layer may be gradually migrate to the inner layer and, thus, may exchange with the Cd ions in the inner layer. Similarly, the Cd ions in the inner layer may be gradually migrate to the out layer and, thus, may exchange with the Zn ions in the outer layer. Moreover, the migration distance of the cations is limited, and the migration probability decreases as the migration distance increases. Therefore, a gradient alloy composition distribution, with the Cd concentration gradually decreasing while the Zn concentration gradually increasing along the radial direction from the inner layer to the outer layer, i.e., $Cd_xZn_{1-x}Se$, where $0 \leq x \leq 1$, may be formed near the interface between the CdSe layer and the ZnSe layer. In addition, the value of x may decrease monotonically from 1 to 0 along the direction (i.e., the radial direction) from the inner layer to the outer layer.

Embodiment 6: Preparation of a CdSeS/ZnSeS-Based QD

First, a cationic cadmium precursor, an anionic selenium precursor, and an anionic sulfur precursor may be injected into a reaction system to form a $CdSe_bS_{1-b}$ layer, where $0 \leq b \leq 1$. Further, a cationic zinc precursor together with the anionic selenium precursor and the anionic sulfur precursor may be continuously injected into the reaction system to form a $ZnSe_cS_{1-c}$ layer on the surface of the $CdSe_bS_{1-b}$ layer, where $0 \leq c \leq 1$. Under certain reaction conditions including an appropriate heating temperature and an appropriate heating time, the Zn cations in the outer layer may be gradually migrate to the inner layer and, thus, may exchange with the Cd ions in the inner layer. Similarly, the Cd ions in the inner layer may be gradually migrate to the out layer and, thus, may exchange with the Zn ions in the outer layer. Moreover, the migration distance of the cations is limited, and the migration probability decreases as the migration distance increases. Therefore, a gradient alloy composition distribution, with the Cd concentration gradually decreasing while the Zn concentration gradually increasing along the radial direction from the inner layer to the outer layer, i.e., $Cd_xZn_{1-x}Se_aS_{1-a}$, where $0 \leq x \leq 1$ and $0 \leq a \leq 1$, may be formed near the interface between the $CdSe_bS_{1-b}$ layer and the $ZnSe_cS_{1-c}$ layer. In addition, the value of x may decrease monotonically from 1 to 0 along the direction (i.e., the radial direction) from the inner layer to the outer layer.

Embodiment 7: Preparation of a ZnS/CdS-Based QD

First, a cationic zinc precursor and an anionic sulfur precursor may be injected into a reaction system to form a ZnS layer. Further, a cationic cadmium precursor together with the anionic sulfur precursor may be continuously injected into the reaction system to form a CdS layer on the surface of the ZnS layer. Under certain reaction conditions including an appropriate heating temperature and an appropriate heating time, the Cd cations in the outer layer may be gradually migrate to the inner layer and, thus, may exchange with the Zn ions in the inner layer. Similarly, the Zn ions in the inner layer may be gradually migrate to the out layer and, thus, may exchange with the Cd ions in the outer layer. Moreover, the migration distance of the cations is limited, and the migration probability decreases as the migration distance increases. Therefore, a gradient alloy composition distribution, with the Zn concentration gradually decreasing while the Cd concentration gradually increasing along the radial direction from the inner layer to the outer layer, i.e., $Cd_xZn_{1-x}S$, where $0 \leq x \leq 1$, may be formed near the interface between the ZnS layer and the CdS layer. In addition, the value of x may increase monotonically from 0 to 1 along the direction (i.e., the radial direction) from the inner layer to the outer layer.

Embodiment 8: Preparation of a ZnSe/CdSe-Based QD

First, a cationic zinc precursor and an anionic selenium precursor may be injected into a reaction system to form a ZnSe layer. Further, a cationic cadmium precursor together with the anionic selenium precursor may be continuously injected into the reaction system to form a CdSe layer on the surface of the ZnSe layer. Under certain reaction conditions including an appropriate heating temperature and an appropriate heating time, the Cd cations in the outer layer may be gradually migrate to the inner layer and, thus, may exchange with the Zn ions in the inner layer. Similarly, the Zn ions in the inner layer may be gradually migrate to the out layer and, thus, may exchange with the Cd ions in the outer layer. Moreover, the migration distance of the cations is limited, and the migration probability decreases as the migration distance increases. Therefore, a gradient alloy composition distribution, with the Zn concentration gradually decreasing while the Cd concentration gradually increasing along the radial direction from the inner layer to the outer layer, i.e., $Cd_xZn_{1-x}Se$, where $0 \leq x \leq 1$, may be formed near the interface between the ZnSe layer and the CdSe layer. In addition, the value of x may increase monotonically from 0 to 1 along the direction (i.e., the radial direction) from the inner layer to the outer layer.

Embodiment 9: Preparation of a ZnSeS/CdSeS-Based QD

First, a cationic zinc precursor, an anionic selenium precursor, and an anionic sulfur precursor may be injected into a reaction system to form a $ZnSe_bS_{1-b}$ layer, where $0 \leq b \leq 1$. Further, a cationic cadmium precursor together with the anionic selenium precursor and the anionic sulfur precursor may be continuously injected into the reaction system to form a $ZnSe_cS_{1-c}$ layer on the surface of the $ZnSe_bS_{1-b}$ layer, where $0 \leq c \leq 1$. Under certain reaction conditions including an appropriate heating temperature and an appropriate heating time, the Cd cations in the outer layer may be gradually migrate to the inner layer and, thus, may exchange with the Zn ions in the inner layer. Similarly, the Zn ions in the inner layer may be gradually migrate to the out layer and, thus, may exchange with the Cd ions in the outer layer. Moreover, the migration distance of the cations is limited, and the migration probability decreases as the migration distance increases. Therefore, a gradient alloy composition distribution, with the Zn concentration gradually decreasing while the Cd concentration gradually increasing along the radial direction from the inner layer to the outer layer, i.e., $Cd_xZn_{1-x}Se_aS_{1-a}$, where $0 \leq x \leq 1$ and $0 \leq a \leq 1$, may be formed near the interface between the $ZnSe_bS_{1-b}$ layer and the $ZnSe_cS_{1-c}$ layer. In addition, the value of x may increase monotonically from 0 to 1 along the direction (i.e., the radial direction) from the inner layer to the outer layer.

Embodiment 10: Preparation of a Blue QD $Cd_xZn_{1-x}S$ with a Funnel-Shaped Energy-Level Structure Preparation of a cadmium oleate and zinc oleate precursor: 1 mmol of cadmium oxide (CdO), 9 mmol of zinc acetate [$Zn(acet)_2$], 8 mL of oleic acid, and 15 mL of 1-octadecene may be placed in a 100 mL three-neck flask, and may then be degassed for 60 minutes under vacuum at a temperature of 80° C. to obtain the cadmium oleate and zinc oleate precursor. Then, the cadmium oleate and zinc oleate precursor may be stored in a nitrogen environment at the same temperature (i.e., 80° C.) for later use.

2 mmol of sulfur powder may be dissolved in 3 mL of 1-octadecene to form a sulfur-1-octadecene precursor.

6 mmol of sulfur powder may be dissolved in 3 mL of trioctylphosphine to form a sulfur-trioctylphosphine precursor.

0.6 mmol of cadmium oxide (CdO), 0.6 mL of oleic acid, and 5.4 mL of 1-octadecene may be placed in a 100 mL three-neck flask, and may then be heated under reflux in a nitrogen environment at 250° C. for 120 minutes to obtain a transparent cadmium oleate precursor.

Figure 2:
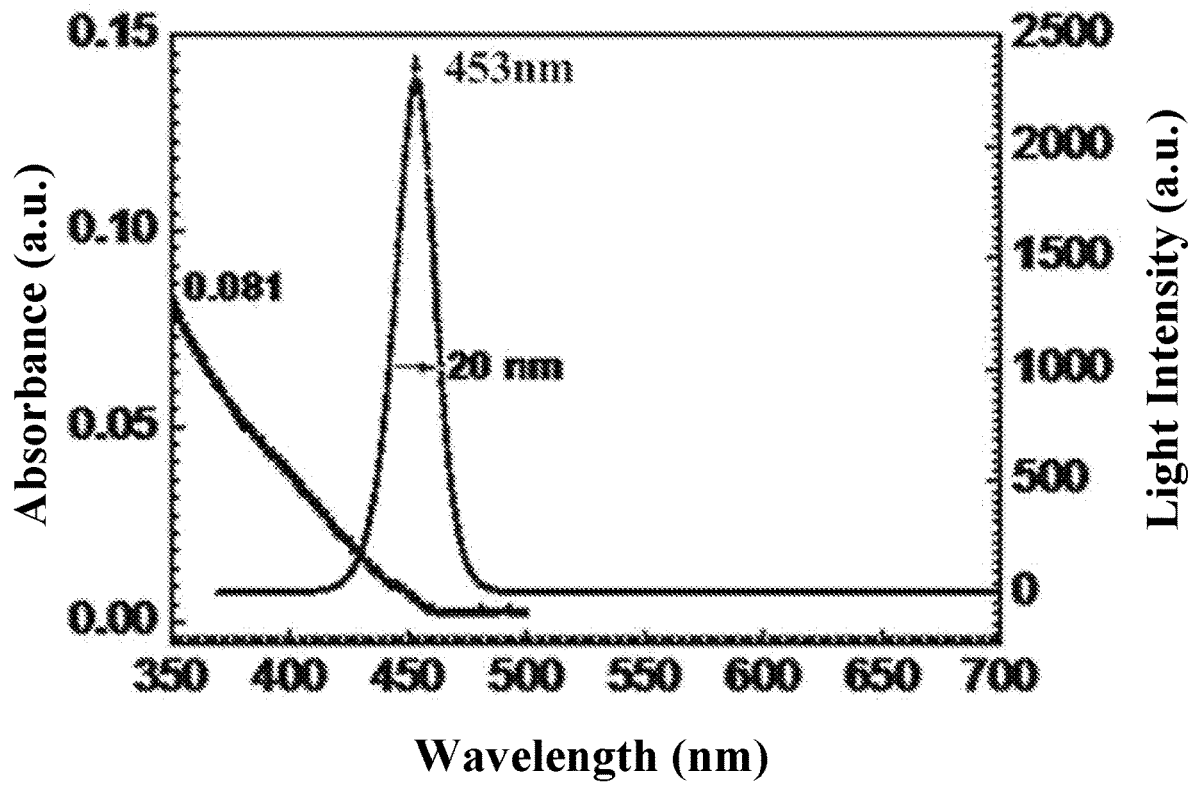
FIG. 2 illustrates a schematic diagram of the light-emission peak wavelength of a QD in Embodiment 10 of the present invention.

Under a nitrogen environment, the cadmium oleate and zinc oleate precursor may be heated to 310° C., and then the sulfur-1-octadecene precursor may be rapidly injected into the reaction system. After 10 minutes of reaction, 3 mL of the sulfur-trioctylphosphine precursor and 6 mL of the cadmium oleate precursor may be simultaneously injected into the reaction system with injection rates of 3 mL/h and 10 mL/h, respectively. After the reaction is completed and the reaction system is cooled down to room temperature, the reaction product may be repeatedly dissolved with toluene and anhydrous methanol and precipitated, and then purified by centrifugation. As such, a blue QD $Cd_xZn_{1-x}S$ having a funnel-shaped energy-level structure may be obtained. As shown in FIG. 2, the light-emission peak wavelength of the blue QD may be 453 nm, the FWHM of the light-emission peak of the blue QD may be 20 nm, and the absorbance of the blue QD may gradually decrease with increasing wavelength.

Embodiment 11: Preparation of a Green QD $Cd_xZn_{1-x}Se_yS_{1-y}/Cd_zZn_{1-z}S$ with a Funnel-Shaped Energy-Level Structure Preparation of a cadmium oleate and zinc oleate precursor: 0.4 mmol of cadmium oxide (CdO), 8 mmol of zinc acetate $[Zn(acet)_2]$, and 10 mL of oleic acid may be placed in a 100 mL three-neck flask, and may then be degassed for 60 minutes under vacuum at a temperature of 80° C. to obtain the cadmium oleate and zinc oleate precursor. Then, the cadmium oleate and zinc oleate precursor may be stored in a nitrogen environment at the same temperature (i.e., 80° C.) for later use.

2 mmol of selenium powder and 4 mmol of sulfur powder may be dissolved in 4 mL of trioctylphosphine to form a selenium-trioctylphosphine and sulfur-trioctylphosphine precursor.

2 mmol of sulfur powder may be dissolved in 2 mL of trioctylphosphine to form a sulfur-trioctylphosphine precursor.

Figure 3:
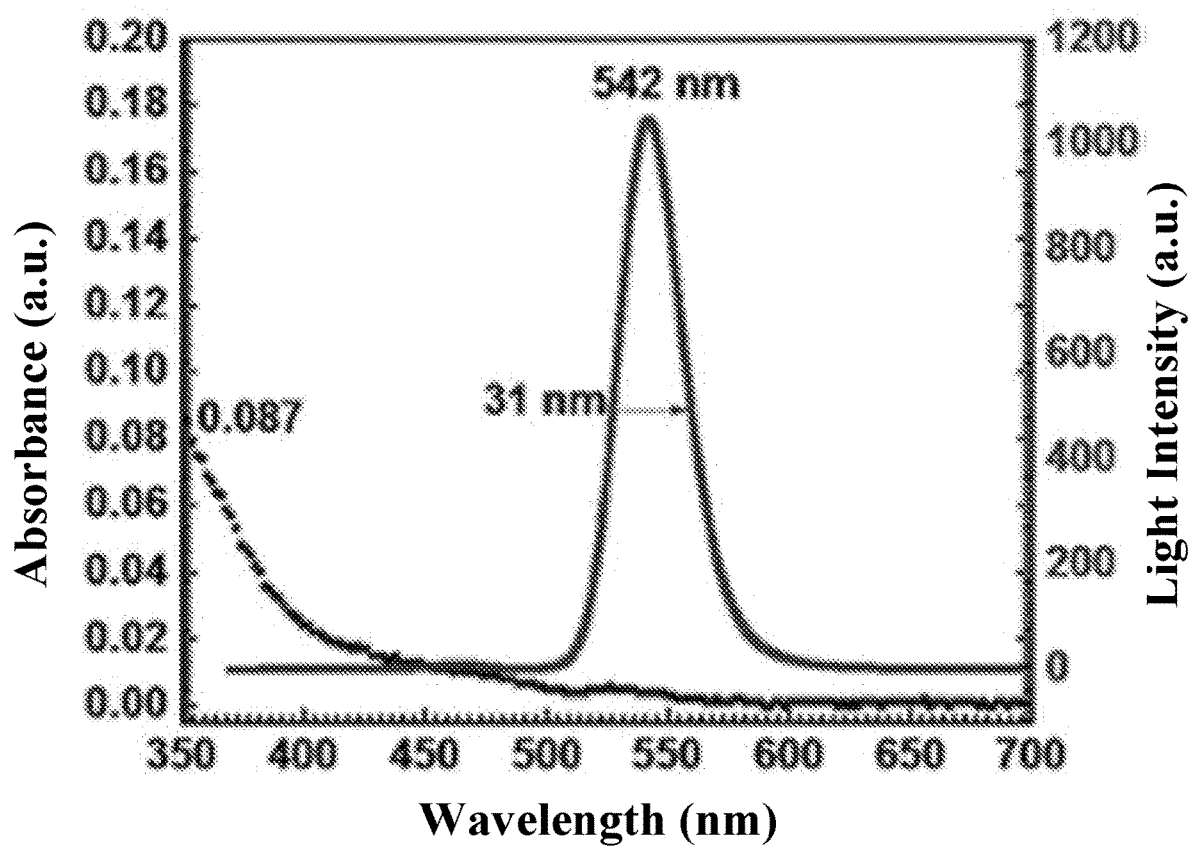
FIG. 3 illustrates a schematic diagram of the light-emission peak wavelength of a QD in Embodiment 11 of the present invention.

Under a nitrogen environment, the cadmium oleate and zinc oleate precursor may be heated to 310° C., and then the selenium-trioctylphosphine and sulfur-trioctylphosphine precursor may be rapidly injected into the reaction system to form $Cd_xZn_{1-x}Se_yS_{1-y}$. After 10 minutes of reaction, 2 mL of the sulfur-trioctylphosphine precursor may be added dropwise to the reaction system with an injection rate of 8 mL/h until the precursor is completely injected. After the reaction is completed and the reaction system is cooled down to room temperature, the reaction product may be repeatedly dissolved with toluene and anhydrous methanol, precipitated, and then purified by centrifugation. As such, a green QD $Cd_xZn_{1-x}Se_yS_{1-y}/Cd_zZn_{1-z}S$ having a funnel-shaped energy-level structure may be obtained. As shown in FIG. 3, the light-emission peak wavelength of the green QD may be 542 nm, the FWHM of the light-emission peak of the green QD may be 31 nm, and the absorbance of the green QD may gradually decrease with increasing wavelength.

Embodiment 12: Preparation of a Red QD $Cd_xZn_{1-x}Se_yS_{1-y}/Cd_zZn_{1-z}S$ with a Funnel-Shaped Energy-Level Structure Preparation of a cadmium oleate and zinc oleate precursor: 0.8 mmol of cadmium oxide (CdO), 12 mmol of zinc acetate $[Zn(acet)_2]$, and 14 mL of oleic acid may be placed in a 100 mL three-neck flask, and may then be degassed for 60 minutes under vacuum at a temperature of 80° C. to obtain the cadmium oleate and zinc oleate precursor. Then, the cadmium oleate and zinc oleate precursor may be stored in a nitrogen environment at the same temperature (i.e., 80° C.) for later use.

2 mmol of selenium powder may be dissolved in 4 mL of trioctylphosphine to form a selenium-trioctylphosphine precursor.

0.2 mmol of selenium powder and 0.6 mmol of sulfur powder may be dissolved in 2 mL of trioctylphosphine to form a selenium-trioctylphosphine and sulfur-trioctylphosphine precursor.

Figure 4:
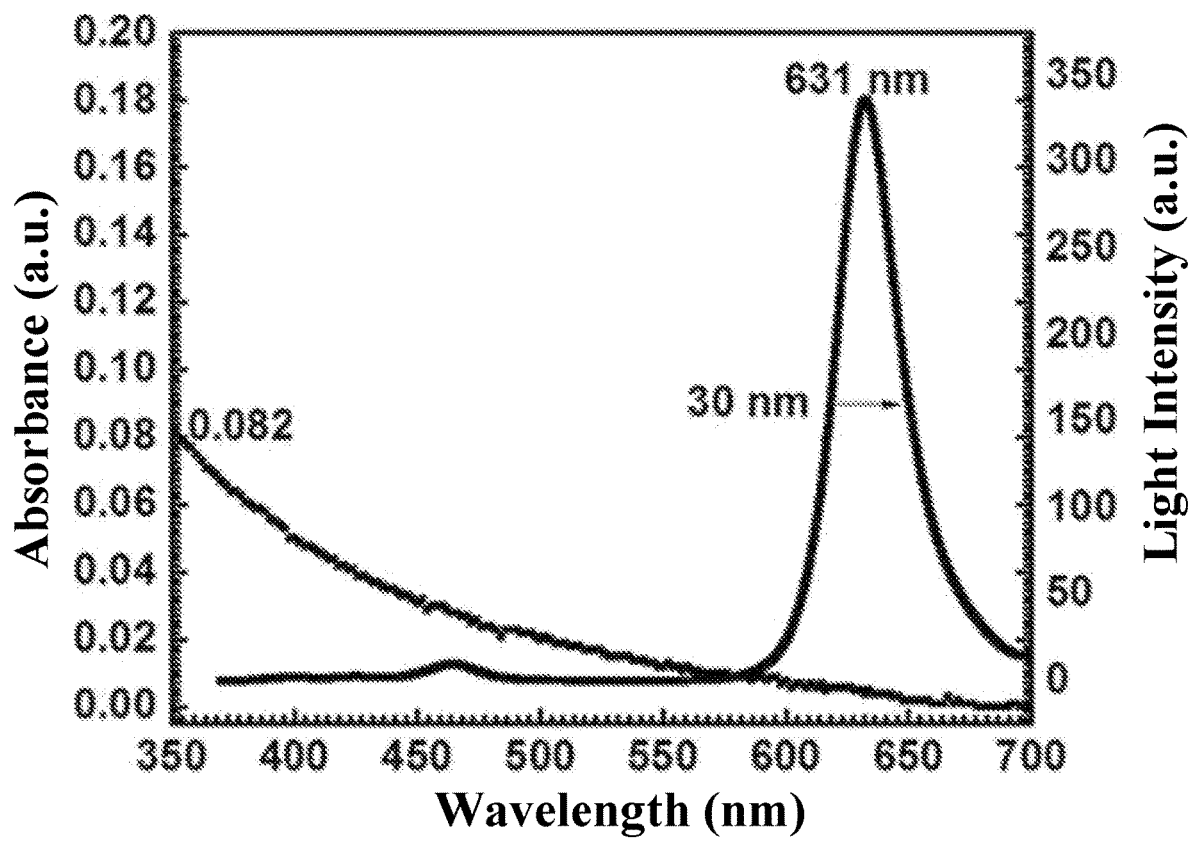
FIG. 4 illustrates a schematic diagram of the light-emission peak wavelength of a QD in Embodiment 12 of the present invention.

Under a nitrogen environment, the cadmium oleate and zinc oleate precursor may be heated to 310° C., and then the selenium-trioctylphosphine precursor may be rapidly injected into the reaction system to form $Cd_xZn_{1-x}Se$. After 10 minutes of reaction, 2 mL of the selenium-trioctylphosphine and sulfur-trioctylphosphine precursor may be added dropwise to the reaction system with an injection rate of 4 mL/h. After the reaction is completed and the reaction system is cooled down to room temperature, the reaction product may be repeatedly dissolved with toluene and anhydrous methanol, precipitated, and then purified by centrifugation. As such, a red fluorescent QD $Cd_xZn_{1-x}Se_yS_{1-y}/Cd_zZn_{1-z}S$ having a funnel-shaped energy-level structure may be obtained. As shown in FIG. 4, the light-emission peak wavelength of the red fluorescent QD may be 631 nm, the FWHM of the light-emission peak of the red QD may be 30 nm, and the absorbance of the red QD may gradually decrease with increasing wavelength.

Embodiment 13: Influence of the Injection Rate of the Cadmium Oleate Precursor on the Preparation of a Red QD with a Funnel-Shaped Energy-Level Structure Based on the exemplary method described in Embodiment 10, the preparation method for the blue QD may further adjust the injection rate of the cadmium oleate precursor to control the slope of the composition gradient of the QD and, thus, change the energy-level structure to further realize the control of the emission wavelength of the QD.

Preparation of a cadmium oleate and zinc oleate precursor: 1 mmol of cadmium oxide (CdO), 9 mmol of zinc acetate $[Zn(acet)_2]$, 8 mL of oleic acid, and 15 mL of 1-octadecene may be placed in a 100 mL three-neck flask, and may then be degassed for 60 minutes under vacuum at a temperature of 80° C. to obtain the cadmium oleate and zinc oleate precursor. Then, the cadmium oleate and zinc oleate precursor may be stored in a nitrogen environment at the same temperature (i.e., 80° C.) for later use.

2 mmol of sulfur powder may be dissolved in 3 mL of 1-octadecene to form a sulfur-1-octadecene precursor.

6 mmol of sulfur powder may be dissolved in 3 mL of trioctylphosphine to form a sulfur-trioctylphosphine precursor.

0.6 mmol of cadmium oxide (CdO), 0.6 mL of oleic acid, and 5.4 mL of 1-octadecene may be placed in a 100 mL three-neck flask, and may then be heated under reflux in a nitrogen environment at 250° C. for 120 minutes to obtain a transparent cadmium oleate precursor.

Under a nitrogen environment, the cadmium oleate and zinc oleate precursor may be heated to 310° C., and then the sulfur-1-octadecene precursor may be rapidly injected into the reaction system. After 10 minutes of reaction, 3 mL of the sulfur-trioctylphosphine precursor may be added dropwise to the reaction system with an injection rate of 3 mL/h, and in the meantime, the cadmium oleate precursor may also be added dropwise to the reaction system at different rates. After the reaction is completed and the reaction system is cooled down to room temperature, the reaction product may be repeatedly dissolved with toluene and anhydrous methanol and precipitated, and then purified by centrifugation to obtain a blue QD $Cd_xZn_{1-x}S/Cd_yZn_{1-y}S$ having a funnel-shaped energy-level structure.

A list of the adjusted emission wavelengths of various QDs, prepared based on a same QD center (an alloy QD with a light-emission peak wavelength of 447 nm) and different injection rates of the cadmium oleate precursor, is as follows:

| Injection rate of the cadmium oleate precursor (mmol/h) | Emission wavelength (nm) |
|---|---|
| 0.5 | 449 |
| 0.75 | 451 |
| 1 | 453 |
| 1.25 | 455 |
| 1.5 | 456 |

Embodiment 14: Influence of the Injection Volume of the Cadmium Oleate Precursor on the Preparation of a Blue QD with a Funnel-Shaped Energy-Level Structure Based on the methods described in Embodiment 10 and Embodiment 13, the preparation method for the blue QD may further adjust the injection volume of the cadmium oleate precursor to control the range of gradient change of the composition of the QD and, thus, change the energy-level structure to further realize the control of the emission wavelength of the QD. A list of the adjusted emission wavelengths of various QDs, prepared based on a same QD center (an alloy QD with a light-emission peak wavelength of 447 nm) and different injection volumes of the cadmium oleate precursor (under a same injection rate of 1 mmol/h), is as follows:

| Injection volume of the cadmium oleate precursor (mmol) | Emission wavelength (nm) |
|---|---|
| 0.4 | 449 |
| 0.5 | 451 |
| 0.6 | 453 |
| 0.8 | 454 |
| 1.0 | 455 |

Embodiment 15

Figure 5:
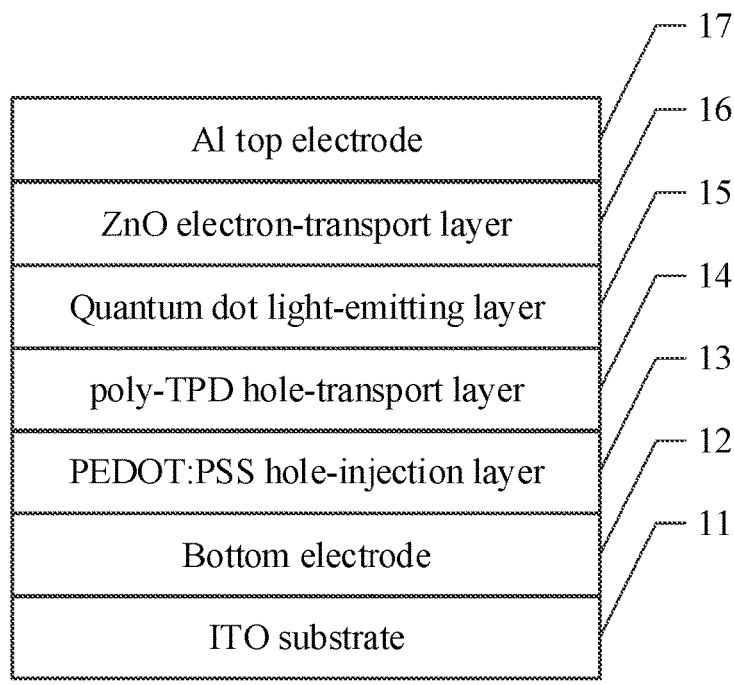
FIG. 5 illustrates a schematic structural view of a QD light-emitting diode in Embodiment 15 of the present invention.

As shown in FIG. 5, an exemplary QD light-emitting diode may include, from the bottom to the top, an indium tin oxide (ITO) substrate 11, a bottom electrode 12, a PEDOT:PSS [poly(3,4-ethylenedioxythiophene) polystyrene sulfonate] hole-injection layer 13, a poly-TPD [poly(4-butylphenyl-diphenyl-amine)] hole-transport layer 14, a light-emitting layer 15, a ZnO electron-transport layer 16, and an Al top electrode 17.

The QD light-emitting diode may be prepared by an exemplary method including the following steps.

After a bottom electrode 12, a PEDOT:PSS hole-injection layer 13 with a thickness of 30 nm, and a poly-TPD hole-transport layer 14 with a thickness of 30 nm are sequentially prepared on an ITO substrate 11, a QD light-emitting layer 15 with a thickness of 20 nm may be prepared on the poly-TPD hole-transport layer 14. Further, a ZnO electron-transport layer 16 with a thickness of 40 nm, and an Al top electrode 17 with a thickness of 100 nm may be formed on the QD light-emitting layer 15. The QD material of the QD light-emitting layer 15 may be a QD material in Embodiment 10 of the present invention.

Embodiment 16

Figure 6:
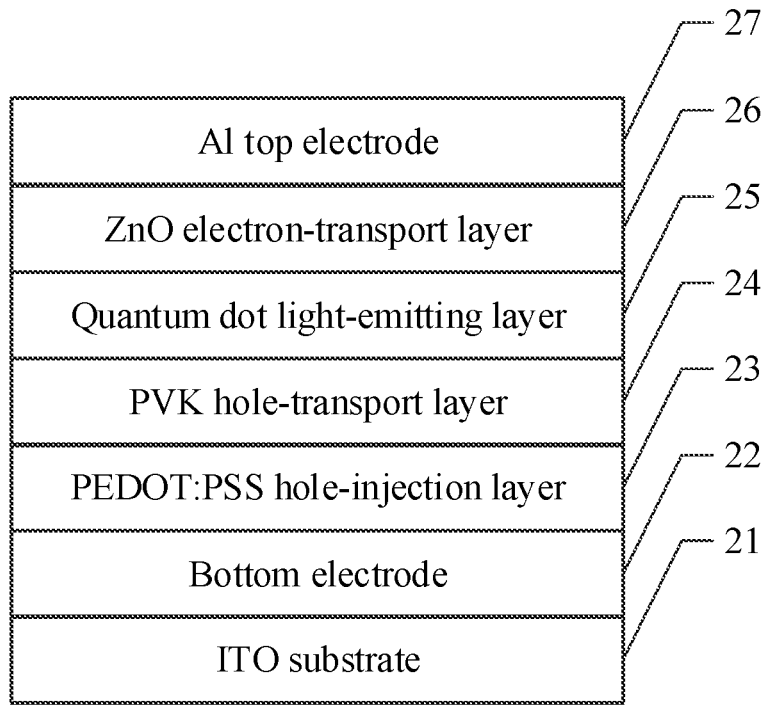
FIG. 6 illustrates a schematic structural view of a QD light-emitting diode in Embodiment 16 of the present invention.

As shown in FIG. 6, an exemplary QD light-emitting diode may include, from the bottom to the top, an ITO substrate 21, a bottom electrode 22, a PEDOT:PSS hole-injection layer 23, a PVK [poly(9-vinylcarbazole)] hole-transport layer 24, a light-emitting layer 25, a ZnO electron-transport layer 26, and an Al top electrode 27.

The QD light-emitting diode may be prepared by an exemplary method including the following steps.

After a bottom electrode 22, a PEDOT:PSS hole-injection layer 23 with a thickness of 30 nm, and a PVK hole-transport layer 24 with a thickness of 30 nm are sequentially prepared on an ITO substrate 21, a QD light-emitting layer 25 with a thickness of 20 nm may be prepared on the PVK hole-transport layer 24. Further, a ZnO electron-transport layer 26 with a thickness of 40 nm, and an Al top electrode 27 with a thickness of 100 nm may be formed on the QD light-emitting layer 25. The QD material of the QD light-emitting layer 25 may be a QD material in Embodiment 11 of the present invention.

Embodiment 17

Figure 7:
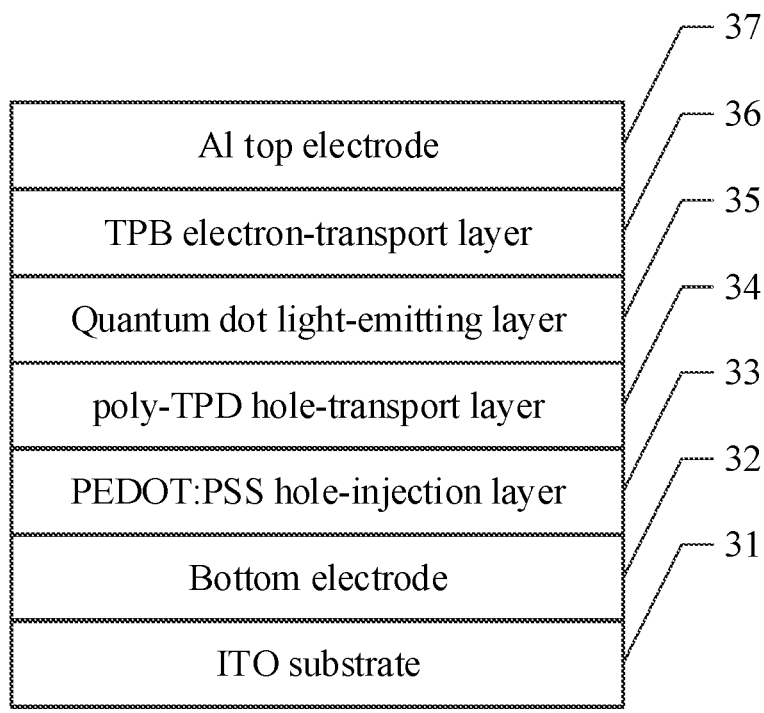
FIG. 7 illustrates a schematic structural view of a QD light-emitting diode in Embodiment 17 of the present invention.

As shown in FIG. 7, an exemplary QD light-emitting diode may include, from the bottom to the top, an ITO substrate 31, a bottom electrode 32, a PEDOT:PSS hole-injection layer 33, a poly-TPD hole-transport layer 34, a light-emitting layer 35, a TPBi [2,2',2"-(1,3,5-Benzinetriyl)-tris(1-phenyl-1-H-benzimidazole)] electron-transport layer 36, and an Al top electrode 37.

The QD light-emitting diode may be prepared by an exemplary method including the following steps.

After a bottom electrode 32, a PEDOT:PSS hole-injection layer 33 with a thickness of 30 nm, and a poly-TPD hole-transport layer 34 with a thickness of 30 nm are sequentially prepared on an ITO substrate 31, a QD light-emitting layer 35 with a thickness of 20 nm may be prepared on the poly-TPD hole-transport layer 34. Further, a TPBi electron-transport layer 36 with a thickness of 40 nm, and an Al top electrode 37 with a thickness of 100 nm may be formed on the QD light-emitting layer 35 through evaporation under vacuum. The QD material of the QD light-emitting layer 35 may be a QD material in Embodiment 12 of the present invention.

Embodiment 18

Figure 8:
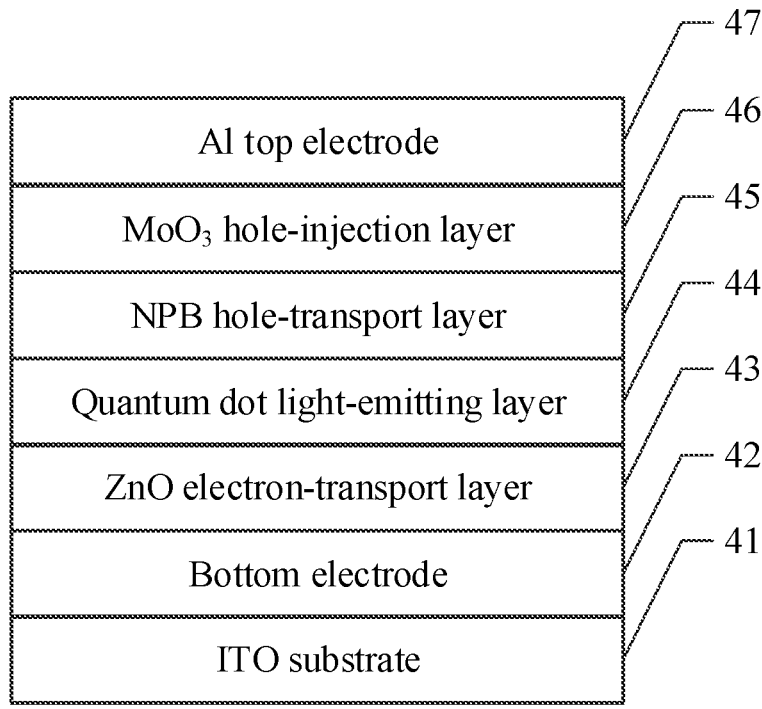
FIG. 8 illustrates a schematic structural view of a QD light-emitting diode in Embodiment 18 of the present invention.

As shown in FIG. 8, an exemplary QD light-emitting diode may include, from the bottom to the top, an ITO substrate 41, a bottom electrode 42, a ZnO electron-transport layer 43, a light-emitting layer 44, a NPB [N,N'-Bis(naphthalen-1-yl)-N,N'-bis(phenyl)benzidine] hole-transport layer 45, a $MoO_3$ hole-injection layer 46, and an Al top electrode 47.

The QD light-emitting diode may be prepared by an exemplary method including the following steps.

A bottom electrode 42 and a ZnO electron-transport layer 43 with a thickness of 40 nm may be sequentially prepared on an ITO substrate 41. A light-emitting layer 44 with a thickness of 20 nm may be formed on the ZnO electron-transport layer 43. Further, a NPB hole-injection layer 45 with a thickness of 30 nm, a MoO$_3$ hole-injection layer 46 with a thickness of 5 nm, and an Al top electrode 47 with a thickness of 100 nm may then be prepared through evaporation under vacuum. The QD material of the QD light-emitting layer 44 may be a QD material in Embodiment 10 of the present invention.

Embodiment 19

Figure 9:
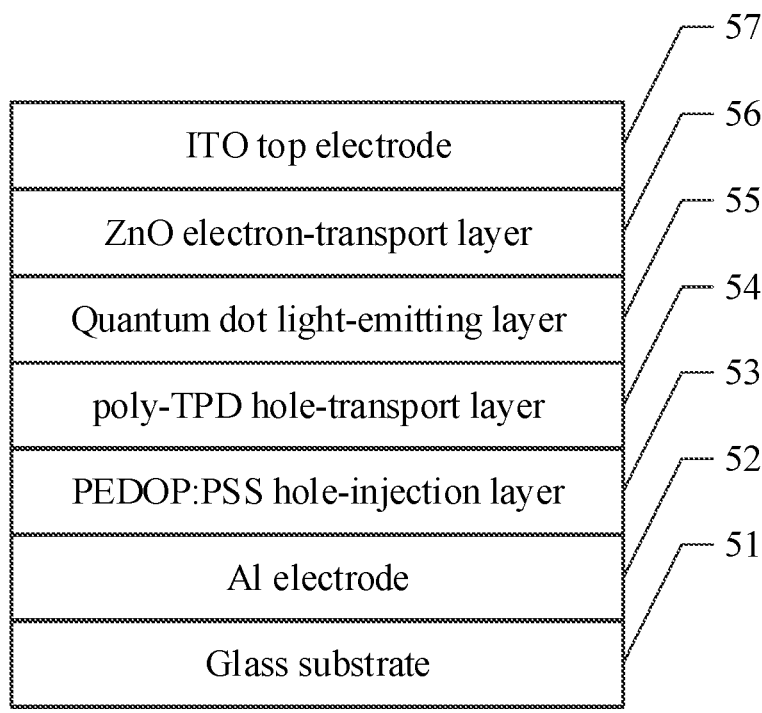
FIG. 9 illustrates a schematic structural view of a QD light-emitting diode in Embodiment 19 of the present invention.

As shown in FIG. 9, an exemplary QD light-emitting diode may include, from the bottom to the top, a glass substrate 51, an Al electrode 52, a PEDOT:PSS hole-injection layer 53, a poly-TPD hole-transport layer 54, a light-emitting layer 55, a ZnO electron-transport layer 56, and an ITO top electrode 57.

The QD light-emitting diode may be prepared by an exemplary method including the following steps.

An Al electrode 52 with a thickness of 100 nm may be formed on a glass substrate 51 through evaporation under vacuum. Further, after a PEDOT:PSS hole-injection layer 53 with a thickness of 30 nm, and a poly-TPD hole-transport layer 54 with a thickness of 30 nm are sequentially prepared, a QD light-emitting layer 55 with a thickness of 20 nm may be prepared on the poly-TPD hole-transport layer 54. Then, a ZnO electron-transport layer 56 with a thickness of 40 nm may be prepared on the QD light-emitting layer 55. Moreover, through a sputtering method, an ITO layer with a thickness of 120 nm may be formed as a top electrode 57. The QD material of the QD light-emitting layer 55 may be a QD material in Embodiment 11 of the present invention.

Embodiment 20

Figure 10:
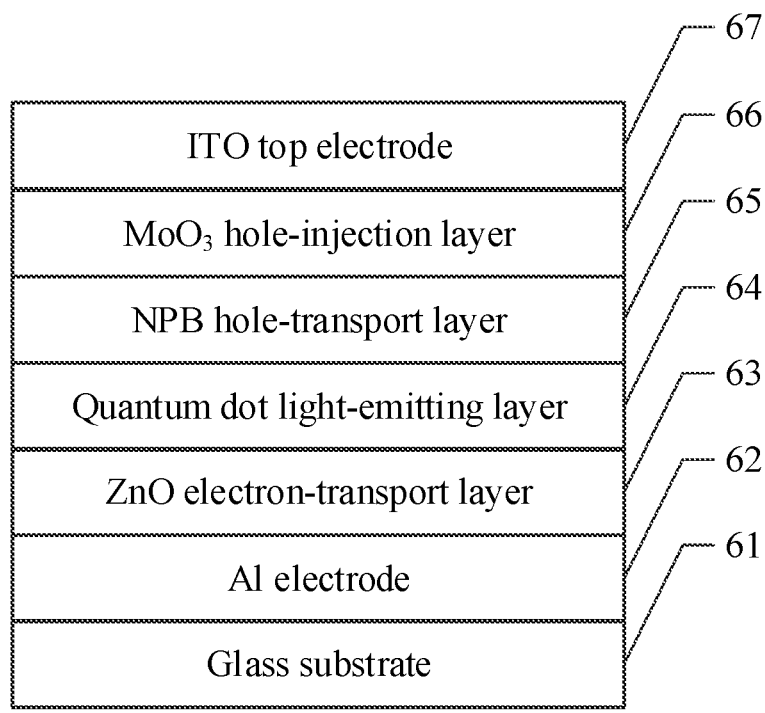
FIG. 10 illustrates a schematic structural view of a QD light-emitting diode in Embodiment 20 of the present invention.

As shown in FIG. 10, an exemplary QD light-emitting diode may include, from the bottom to the top, a glass substrate 61, an Al electrode 62, a ZnO electron-transport layer 63, a light-emitting layer 64, a NPB hole-transport layer 65, a MoO$_3$ hole-injection layer 66, and an ITO top electrode 67.

The QD light-emitting diode may be prepared by an exemplary method including the following steps.

An Al electrode 62 with a thickness of 100 nm may be formed on a glass substrate 61 through evaporation under vacuum. Then, a ZnO electron-transport layer 63 with a thickness of 40 nm, a QD light-emitting layer 64 with a thickness of 20 nm may be sequentially prepared. Further, a NPB hole-injection layer 65 with a thickness of 30 nm and a MoO$_3$ hole-injection layer 66 with a thickness of 5 nm may then be prepared through evaporation under vacuum. Moreover, through a sputtering method, an ITO layer with a thickness of 120 nm may be formed as a top electrode 67. The QD material of the QD light-emitting layer 64 may be a QD material in Embodiment 12 of the present invention.

It should be understood that the application of the present invention is not limited to the above examples and can be improved or transformed by those skilled in the art based on the above description. All these improvements and transformations should fall within the protection scope of the appended claims of the present invention.

What is claimed is:

1. A quantum dot (QD) material, comprising:
a plurality of QD structural units, arranged sequentially along a radial direction of the QD material, wherein the plurality of QD structural units include:
  a first QD structural unit, including nanocrystal of a first compound, wherein the first QD structural unit includes 2-20 monatomic layers each having a fixed alloy composition, or 1-10 unit-cell layers each having a fixed alloy composition, and
  a second QD structural unit, including a layer of a second compound grown on the nanocrystal of the first compound, wherein the second QD structural unit includes 2-20 monatomic layers each having a fixed alloy composition, or 1-10 unit-cell layers each having a fixed alloy composition, and
a continuous alloy composition structure, formed at a boundary of the first QD structural unit and the second QD structural unit, wherein along the radial direction, two monatomic layers at the boundary of the first and second QD structural units form the continuous alloy composition structure, or along the radial direction, two unit-cell layers at the boundary of the first and second QD structural units form the continuous alloy composition structure,
  wherein each QD structural unit has a gradient alloy composition structure with an energy level width gradually Increasing along the radial direction from a center of the QD material to a surface of the QD material; and energy level widths of the first and second QD structural units are continuous.

2. The QD material according to claim 1, wherein:
the gradient alloy composition structure includes Group II elements and Group VI elements.

3. The QD material according to claim 2, wherein:
an alloy composition of each of the first and second QD structural units is $Cd_xZn_{1-x}Se_yS_{1-y}$, where $0 \le x \le 1$, $0 \le x \le 1$, and x and y are not 0 or 1 at a same time.

4. The QD material according to claim 3, wherein:
in each of the first and second QD structural units, an alloy composition at point A is $Cd_x^A Zn_{1-x}^A Se_y^A S_{1-y}^A$, and an alloy composition at point B is $Cd_x^B Zn_{1-x}^B Se_y^B S_{1-y}^B$, wherein the point A is closer to the center of the QD material than the point B, and the alloy composition at the point A and the alloy composition at the point B satisfy $x^A > x^B$, $y^A > y^B$.

5. The QD material according to claim 1, wherein:
a light-emission peak wavelength of the QD material is in a range of approximately 400 nm to 700 nm.

6. The QD material according to claim 1, wherein:
a full width at half maximum of a light-emission peak of the QD material is in a range of approximately 12 nm to 80 nm.

7. The QD material according to claim 1, wherein:
each of the first and second QD structural units, when including the unit-cell layers, has a closed unit-cell surface formed through a continuous connection of the unit-cell layers, and each of the first and second QD structural units has same lattice parameters and same elements.

8. A method for preparing a QD material, comprising:
performing a layer-by-layer growth of a first compound and a second compound, by forming nanocrystal of the first compound; and
  after forming the nanocrystal of the first compound, forming a layer of the second compound on a surface of the nanocrystal of the first compound, wherein the second compound and the first compound have different alloy compositions; and after forming the nanocrystal of the first compound and the layer of the second compound, performing an additional synthesis step including a cation exchange reaction between the first compound and the second compound to form a continuous alloy composition structure there-between, wherein:

a light-emission peak wavelength of the QD material experiences a continuous blue-shift to achieve a gradient alloy composition distribution, the QD material includes a first QD structural unit corresponding to the first compound, and a second QD structural unit corresponding to the second compound, and each of the first and second QD structural units has a fixed composition and includes 2-20 monatomic layers or 1-10 unit-cell layers.

9. The method for preparing the QD material according to claim 8, wherein:
a cation precursor of the first compound and/or the second compound includes a zinc precursor, wherein the zinc precursor includes at least one of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and zinc stearate.

10. The method for preparing the QD material according to claim 8, wherein:
a cation precursor of the first compound and/or the second compound includes a cadmium precursor, wherein the cadmium precursor includes at least one of dimethyl cadmium, diethyl cadmium, cadmium acetate, cadmium acetylacetonate, cadmium Iodide, cadmium bromide, cadmium chloride, cadmium fluoride, cadmium carbonate, cadmium nitrate, cadmium oxide, cadmium perchlorate, cadmium phosphate, cadmium sulfate, cadmium oleate, and cadmium stearate.

11. The method for preparing the QD material according to claim 8, wherein:
an anion precursor of the first compound and/or the second compound includes a selenium precursor, wherein the selenium precursor includes at least one of Se-TOP (selenium-trioctylphosphine), Se-TBP (selenium-tributylphosphine), Se-TPP (selenium-triphenylphosphine), Se-ODE (selenium-1-octadecene), Se-OA (selenium-oleic acid), Se-ODA (selenium-octadecylamine), Se-TOA (selenium-trioctylamine), Se-ODPA (selenium-octadecylphosphonic acid), and Se-OLA (selenium-oleylamine).

12. The method for preparing the QD material according to claim 8, wherein:
an anion precursor of the first compound and/or the second compound includes a sulfur precursor, wherein the sulfur precursor includes at least one of S-TOP (sulfur-trioctylphosphine), S-TBP (sulfur-tributylphosphine), S-TPP (sulfur-triphenylphosphine), S-ODE (sulfur-1-octadecene), S-OA (sulfur-oleic acid), S-ODA (sulfur-octadecylamine), S-TOA (sulfur-trioctylamine), S-ODPA (sulfur-octadecylphosphonic acid), S-OLA (sulfur-oleylamine), and alkyl thiol.

13. The method for preparing the QD material according to claim 8, wherein:
an anion precursor of the first compound and/or the second compound includes a tellurium precursor, wherein the tellurium precursor includes at least one of Te-TOP (tellurium-trioctylphosphine), Te-TBP (tellurium-tributyiphosphine), Te-TPP (tellurium-triphenylphosphine), Te-ODE (tellurium-1-octadecene), Te-OA (tellurium-oleic acid), Te-ODA (tellurium-octadecylamine), Te-TOA (tellurium-trioctylamine), Te-ODPA (tellurium-octadecylphosphonic acid), and Te-OLA (tellurium-oleylamine).

14. The method for preparing the QD material according to claim 8, wherein:
the cation exchange reaction between the first compound and the second compound is performed under a heating condition.

15. The method for preparing the QD material according to claim 14, wherein:
a heating temperature is in a range of approximately 100° C. to 400° C.

16. The method for preparing the QD material according to claim 14, wherein:
a heating time is in a range of approximately 2 seconds to 24 hours.

17. The method for preparing the QD material according to claim 14, wherein:
a molar feed ratio of a cationic precursor to an anion precursor used for forming the first compound is in a range of approximately 100:1 to 1:50.

18. The method for preparing the QD material according to claim 14, wherein:
a molar feed ratio of a cationic precursor to an anion precursor used for forming the second compound is in a range of approximately 100:1 to 1:50.

19. The method according to claim 8, wherein:
the first compound/the second compound comprise one or more of CdZnSeS/CdZnSeS, CdZnS/CdZnS, CdZnSe/CdZnSe, CdS/ZnS, CdSe/ZnSe, CdSeS/ZnSeS, ZnS/CdS, ZnSe/CdSe, and ZnSeS/CdSeS.

20. A semiconductor device including the QD material according to claim 1, wherein:
the semiconductor device is one of an electroluminescent device, a photoluminescent device, a solar cell, display device, a photoelectric detector, a biological probe, and a nonlinear optical device.

21. A semiconductor device including the QD material according to claim 3, wherein:
the semiconductor device is one of an electroluminescent device, a photoluminescent device, a solar cell, display device, a photoelectric detector, a biological probe, and a nonlinear optical device.

22. A semiconductor device including the QD material according to claim 4, wherein:
the semiconductor device is one of an electroluminescent device, a photoluminescent device, a solar cell, display device, a photoelectric detector, a biological probe, and a nonlinear optical device.

* * * * *